(12) United States Patent
Han

(10) Patent No.: US 7,596,044 B2
(45) Date of Patent: Sep. 29, 2009

(54) SEMICONDUCTOR MEMORY DEVICE HAVING SENSE AMPLIFIER OPERABLE AS A SEMI-LATCH TYPE AND A FULL-LATCH TYPE BASED ON TIMING AND DATA SENSING METHOD THEREOF

(75) Inventor: Gong-Heum Han, Hwasung-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 74 days.

(21) Appl. No.: 11/969,947

(22) Filed: Jan. 7, 2008

(65) Prior Publication Data

US 2008/0165603 A1 Jul. 10, 2008

(30) Foreign Application Priority Data

Jan. 8, 2007 (KR) ...................... 10-2007-0002091

(51) Int. Cl.
*G11C 7/00* (2006.01)
(52) U.S. Cl. ...................... 365/205; 365/207
(58) Field of Classification Search .................. 365/205, 365/207, 190
See application file for complete search history.

(56) References Cited

U.S. PATENT DOCUMENTS

| | | | | |
|---|---|---|---|---|
| 4,843,264 A | * | 6/1989 | Galbraith ..................... 327/55 |
| 6,377,505 B1 | * | 4/2002 | Yamauchi ............... 365/189.14 |
| 6,990,001 B2 | * | 1/2006 | Ma et al. .................. 365/49.17 |
| 7,088,630 B2 | * | 8/2006 | Hung et al. ............... 365/185.2 |

FOREIGN PATENT DOCUMENTS

| | | |
|---|---|---|
| JP | 06-349292 | 12/1994 |
| JP | 08-273370 | 10/1996 |
| JP | 09-180457 | 7/1997 |
| JP | 10-199262 | 7/1998 |
| JP | 2002-093177 | 3/2002 |
| KR | 1999-0062409 | 7/1999 |

* cited by examiner

*Primary Examiner*—Anh Phung
(74) *Attorney, Agent, or Firm*—F. Chau & Assoc., LLC

(57) ABSTRACT

A semiconductor memory device includes a memory cell array having memory cells arranged in rows and columns, a row decoder selecting one of the rows and activating the selected row, a bit-line sense amplifier detecting and amplifying data of the memory cells coupled to the selected row through the columns, a data-bus sense amplifier detecting and amplifying data output from the bit-line sense amplifier, and a control logic block enabling the bit-line and data-bus sense amplifiers in a reading operation, operating the data-bus sense amplifier in a semi-latch type mode for a predetermined period, and operating the data-bus sense amplifier in a full-latch type mode after the predetermined period.

9 Claims, 4 Drawing Sheets

SEMICONDUCTOR MEMORY DEVICE HAVING SENSE AMPLIFIER OPERABLE AS A SEMI-LATCH TYPE AND A FULL-LATCH TYPE BASED ON TIMING AND DATA SENSING METHOD THEREOF

CROSS-REFERENCE TO RELATED APPLICATION

This U.S. non-provisional patent application claims priority under 35 U.S.C. §119 of Korean Patent Application No. 10-2007-02091 filed on Jan. 8, 2007, the entire contents of which are incorporated herein by reference.

BACKGROUND

The present disclosure relates to semiconductor memory devices and, more particularly, to a semiconductor memory device having a data bus sense amplifier variable in latch type operational mode in accordance with a predetermined timing.

Generally, in semiconductor memory devices, sense amplifiers operate to detect and amplify low-level signals stored in cell arrays, and transfer the detected and amplified signals to data output buffers.

A typical semiconductor memory device is organized by including a cell array, a row decoder, a bit line (BL) sense amplifier, a data bus (DB) sense amplifier, a column decoder, and a control logic block.

A procedure of reading data from a cell of the semiconductor memory device to an external device, for example, a memory controller, is as follows. The row decoder of the semiconductor memory device receives a row address and activates a word line corresponding to the row address. The BL sense amplifier is enabled by the control logic block and then latches the cell data of the active word line. The column decoder receives a column address and provides the DB sense amplifier with BL sense-amplified information in correspondence with the column address. The DB sense amplifier is enabled by the control logic block. The DB sense amplifier detects and amplifies the BL sense-amplified information, and outputs the amplified signal to the data output buffer.

The DB sense amplifier operates in one of a semi-latch type and a full-latch type, while detecting and amplifying the BL sense-amplified information.

With the semi-latch type, the DB sense amplifier operates to output correct data, even though an input signal fluctuates because of noise. In other words, even upon detecting erroneous data, if the correct data is input again thereafter, the DB sense amplifier detects and amplifies the re-input correct data and outputs the amplified correct data. Thus, the DB sense amplifier of the semi-latch type is useful in improving the noise margin characteristic. But the semi-latch DB sense amplifier has disadvantages in that there is much more current consumption in circuit operation, and an output signal swings less in its full range. Here, 'full swing' means a state that an output signal is amplified to the level of a supply voltage (Vcc) applied to a sense amplifier.

With the full-latch type, the DB sense amplifier is operable with only small current dissipation, while amplifying an input signal to a full power supply level. The DB sense amplifier of the full-latch type is able to operate in full swing. But, the DB sense amplifier of the full-latch type may output erroneous data when an input signal fluctuates because of noise. In other words, even though correct data is input again after an input of erroneous data, the DB sense amplifier of the full-latch type is unable to detect and amplify the correct data, but detects and amplifies the erroneous data and outputs the amplified erroneous data. Thus, the DB sense amplifier of the full-latch type is more susceptible to noise than the semi-latch type one.

As a result, the DB sense amplifier of the semi-latch type dissipates a lot of current with an insufficient full swing, while the DB sense amplifier of the full-latch type is susceptible to noise and can produce erroneous data.

SUMMARY OF THE INVENTION

Exemplary embodiments of the present invention are directed to a semiconductor memory device having a DB sense amplifier that is capable of conducting a stable sense-amplifying function, and a data sensing method thereof.

Exemplary embodiments of the present invention are directed to a semiconductor memory device having a DB sense amplifier that is resistant to noise, and a data sensing method thereof.

An exemplary embodiment of the present invention comprises a semiconductor memory device including: a memory cell array having memory cells arranged in rows and columns; a row decoder selecting one of the rows and activating the selected row; a bit-line sense amplifier detecting and amplifying data of the memory cells coupled to the selected row through the columns; a data-bus sense amplifier detecting and amplifying data output from the bit-line sense amplifier, and a control logic block enabling the bit-line and data-bus sense amplifiers in a reading operation, operating the data-bus sense amplifier in a semi-latch type mode for a predetermined period, and operating the data-bus sense amplifier in a full-latch type mode after the predetermined period.

In this exemplary embodiment, the control logic block generates a latch-type selection signal and a sense-amplifier enabling signal.

In this exemplary embodiment, the data-bus sense amplifier is enabled in response to activation of the sense-amplifier enabling signal.

In this exemplary embodiment, the latch-type selection signal is activated in an active period of the sense-amplifier enabling signal during a predetermined period from the beginning of the active period.

According to an exemplary embodiment, the data-bus sense amplifier operates as the semi-latch type in response to activation of the latch-type selection signal.

In this exemplary embodiment, the data-bus sense amplifier operates in the full-latch type in response to inactivation of the latch-type selection signal.

An exemplary embodiment of the present invention provides a semiconductor memory device including: a memory cell array having memory cells arranged in rows and columns; a first sense amplifier detecting and amplifying data of the memory cells coupled to the selected row through the columns; and a second sense amplifier detecting and amplifying data output from the first sense amplifier through a data bus. The second sense amplifier is configured to operate as a semi-latch type for a first sensing period and as a full-latch type for a second sensing period after the first sensing period.

In this exemplary embodiment, the first and second sensing periods form an active period of the second sense amplifier.

An exemplary embodiment of the present invention also provides a data sensing method of a semiconductor memory device having a memory cell array including memory cells arranged in rows and columns. The method is comprised of the steps of: sensing and amplifying data of the memory cells coupled to a selected row through the columns; sensing and amplifying the sensed and amplified data, which is output from a data bus for a first sensing period, in a semi-latch type mode; and sensing and amplifying the sensed and amplified data of the semi-latch type in a full-latch type mode for a second sensing period after the first sensing period.

A further understanding of the nature and advantages of exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the following figures, wherein like reference numerals refer to like parts throughout the various figures unless otherwise specified. In the figures.

DETAILED DESCRIPTION OF EXEMPLARY EMBODIMENTS

Figure 1:
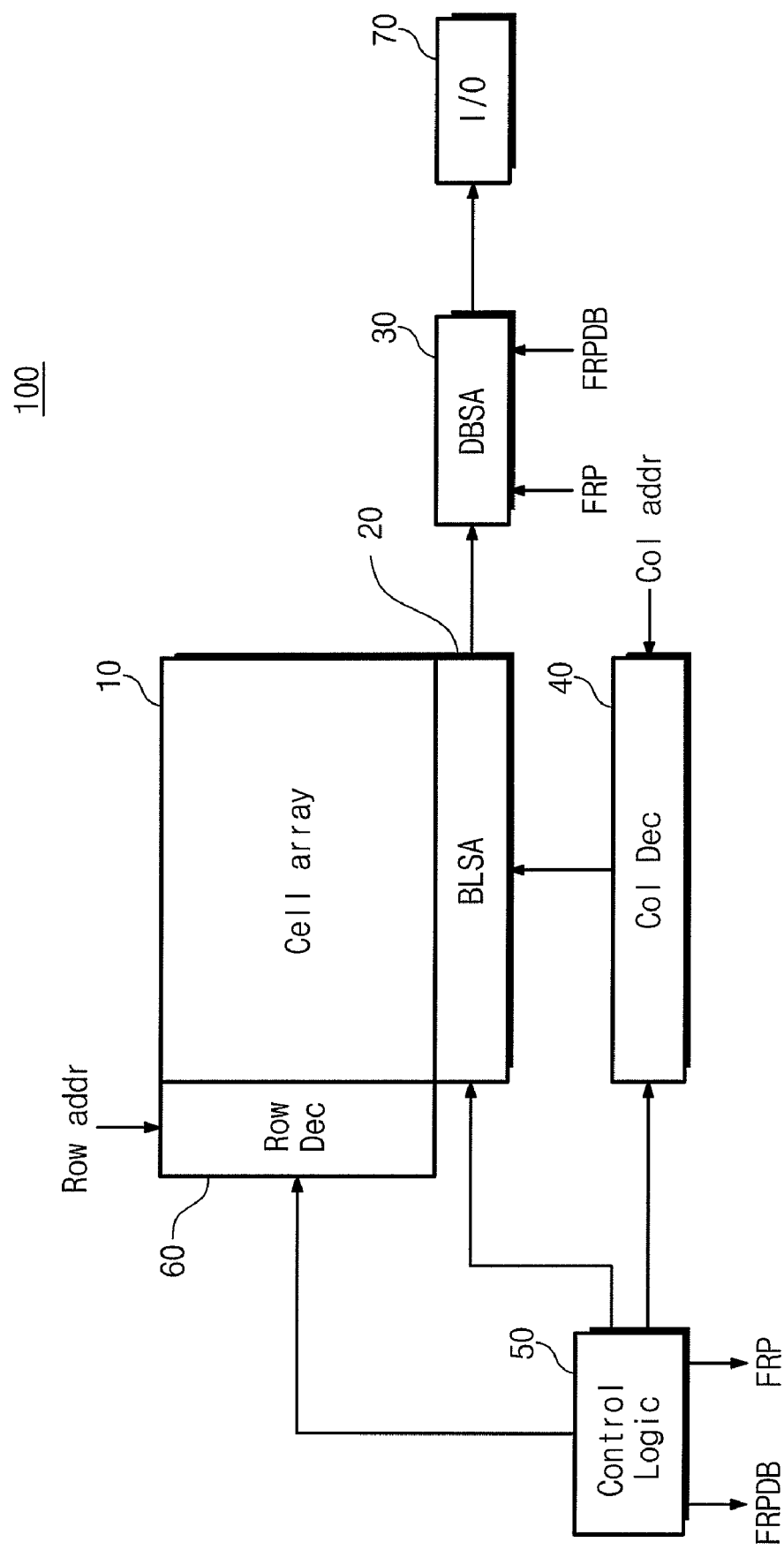
FIG. 1 is a block diagram of a semiconductor memory device according to an exemplary embodiment of the present invention.

Exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

A DB sense amplifier of a semiconductor memory device according to an exemplary embodiment of the present invention operates in a semi-latch type mode according to a predetermined timing during a first sensing period in a reading operation. If correct data is input again thereto, even though there has been an input of erroneous data, the DB sense amplifier of the semi-latch type detects and amplifies the correct data. In addition, after operating in the semi-latch type mode, the DB sense amplifier operates in a full-latch type mode according to a predetermined timing during a second sensing period, making sensed data fully swing to reduce current dissipation.

Hereinafter, an exemplary embodiment of the present invention will be described in conjunction with the accompanying drawings.

FIG. 1 is a block diagram of a semiconductor memory device according to an exemplary embodiment of the present invention.

Referring to FIG. 1, the semiconductor memory device 100 according to this exemplary embodiment of the present invention is comprised of a cell array 10, a BL sense amplifier block (BLSA) 20, a DB sense amplifier (DBSA) 30, a column decoder 40, a control logic block 50, a row decoder 60, and an input/output buffer 70. The BL sense amplifier 20 may be referred to as the 'first sense amplifier', whereas the DB sense amplifier 30 may be referred to as the 'second sense amplifier'.

The cell array 10 includes memory cells arranged in a matrix of rows (or word lines) and columns (or bit lines). The row decoder 60 is controlled by the control logic block 50 and selects a word line of the cell array 10 by decoding a row address.

The BL sense amplifier block 20 is enabled by the control logic block 50 that latches cell data of a word line selected by the row decoder 60 during a reading operation and that latches data input externally during a writing operation. The BL sense amplifier block 20 is composed of a plurality of BL sense amplifiers corresponding to each of the bit lines of the cell array 10.

The column decoder 40 is controlled by the control logic block 50 that selects the BL sense amplifier 20 by decoding a column address.

Because the BL sense amplifiers are connected to bit lines corresponding thereto, the column decoder 40 functions practically to select a correspondent bit line of the cell array by decoding a column address. The selected BL sense amplifier 20 stores its latched data into a corresponding one of the cells of a word line selected by the row decoder 60 in the writing operation, and outputs its latched data to the DB sense amplifier 30 through the data bus in the reading operation.

During the reading operation, the DB sense amplifier 30 is enabled by a sense amplifier enabling signal FRP provided from the control logic block 50 and detects and amplifies data input from the BL sense amplifier 20. The DB sense amplifier 30 outputs the sense-amplified data to the external device, for example, a memory controller, through the data input/output buffer 70. The DB sense amplifier 30 operates in the semi-latch type mode from a beginning time during a predetermined period in response to a latch-type selection signal FRPDB provided from the control logic block 50 in an active period, and operates in the full-latch type mode during a rest period, which will be described in detail hereinbelow.

As described above, the DB sense amplifier 30 operates in the semi or full-latch type mode in response to the latch-type selection signal FRPDB and provides a stable sense-amplifying function and an improved immunity against adverse effects caused by noise.

Figure 2:
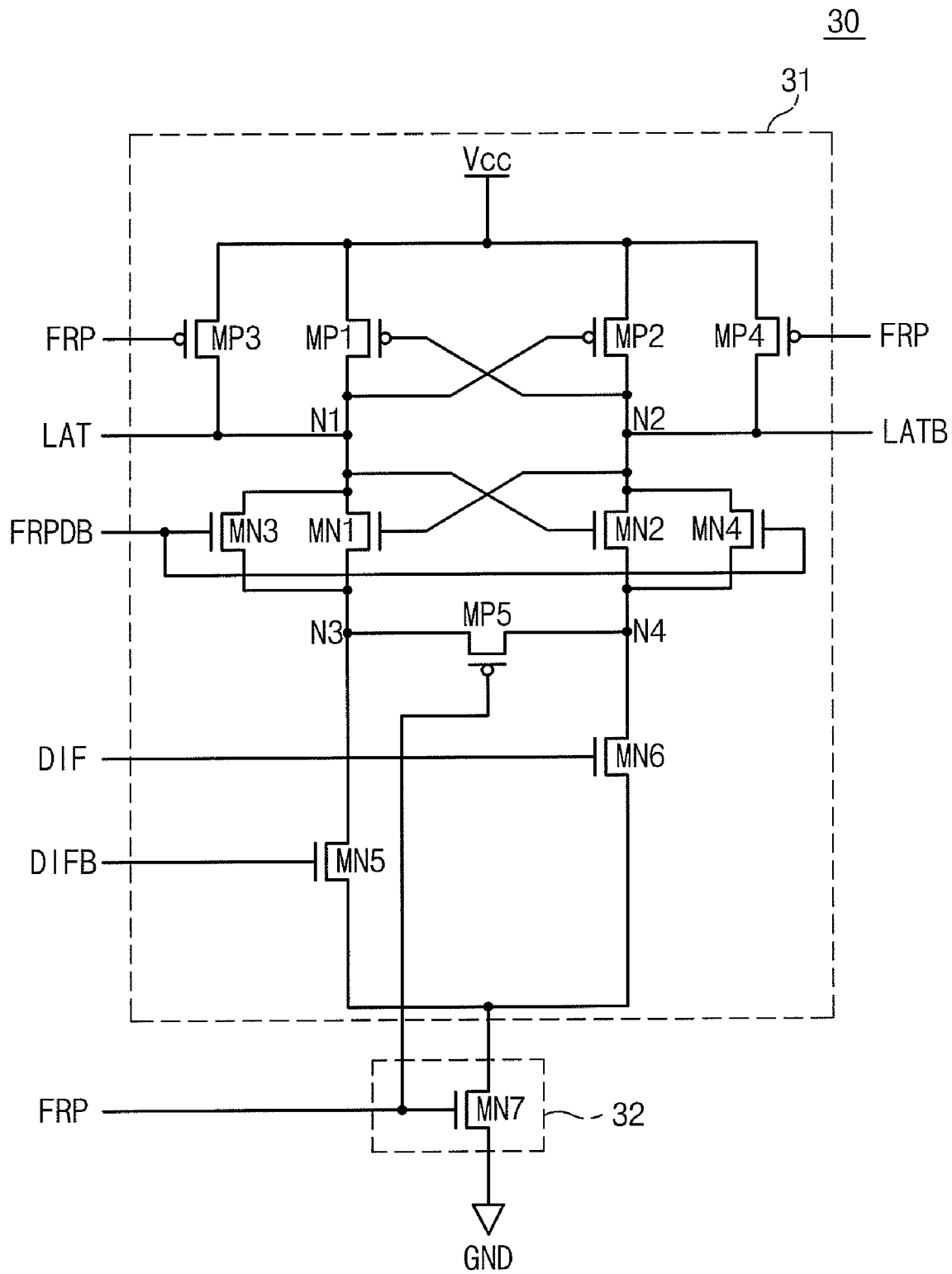
FIG. 2 is a circuit diagram of the data bus sense amplifier illustrated in FIG. 1.

FIG. 2 is a circuit diagram of the DB sense amplifier 30 used in the system shown in FIG. 1.

Referring to FIG. 2, the DB sense amplifier 30 according to this exemplary embodiment of the present invention is comprised of a sense-amplifying circuit 31 and an activation circuit 32.

The sense-amplifying circuit 31 includes PMOS transistors MP1, MP2, MP3, MP4, and MP5, and NMOS transistors MN1, MN2, MN3, MN4, MN5, and MN6. The activation circuit 32 is formed of an NMOS transistor MN7.

In the sense-amplifying circuit 31, sources of the PMOS transistors MP1~MP4 are connected to the power source terminal Vcc. A gate of the PMOS transistor MP3 is coupled to the SA enabling signal FRP generated from the control logic block 50 shown in FIG. 1. A drain of the PMOS transistor MP3 is connected to an output terminal LAT and a node N1. A gate of the PMOS transistor MP4 is coupled to the SA enabling signal FRP generated from the control logic block 50. A drain of the PMOS transistor MP4 is connected to an output terminal LATB and a node N2. A gate of the PMOS transistor MP1 is connected to a gate of the NMOS transistor MN1, a drain of the PMOS transistor MP2, and drains of the NMOS transistors MN2 and MN4, through the node N2. A drain of the PMOS transistor MP1 is connected to a gate of the PMOS transistor MP2, a gate of the NMOS transistor MN2, and drains of the NMOS transistors MN1 and MN3, through the node N1.

Gates of the NMOS transistors MN3 and MN4 are coupled to the latch-type selection signal FRPDB. A source of the NMOS transistor MN3 is connected to a source of the NMOS transistor MN1, a source of the PMOS transistor MP5, and a drain of the NMOS transistor MN5, through a node N3. A source of the NMOS transistor MN4 is connected to a source of the NMOS transistor MN2, a drain of the PMOS transistor MP5, and a drain of the NMOS transistor MN6, through a node N4.

A gate of the PMOS transistor MP5 is coupled to the SA enabling signal FRP generated from the control logic block 50. A gate of the NMOS transistor MN5 is coupled to an input terminal DIFB and a gate of the NMOS transistor MN6 is coupled to an input terminal DIF. Sources of the NMOS transistors MN5 and MN6 are commonly connected to a drain of the NMOS transistor MN7.

In the activation circuit 32, a gate of the NMOS transistor MN7 is coupled to the sense amplifier enabling signal FRP. A source of the NMOS transistor MN7 is connected to the ground GND.

With this interconnection structure, the activation circuit 32 enables the sense-amplifying circuit 31, and the sense-amplifying circuit 31 operates in the semi or full-latch type mode for detecting an input signal.

The PMOS and NMOS transistors, MP1 and MN1, and the PMOS and NMOS transistors, MP2 and MN2, constitute two inverters. These two inverters form a latch circuit as shown in FIG. 2.

Figure 3:
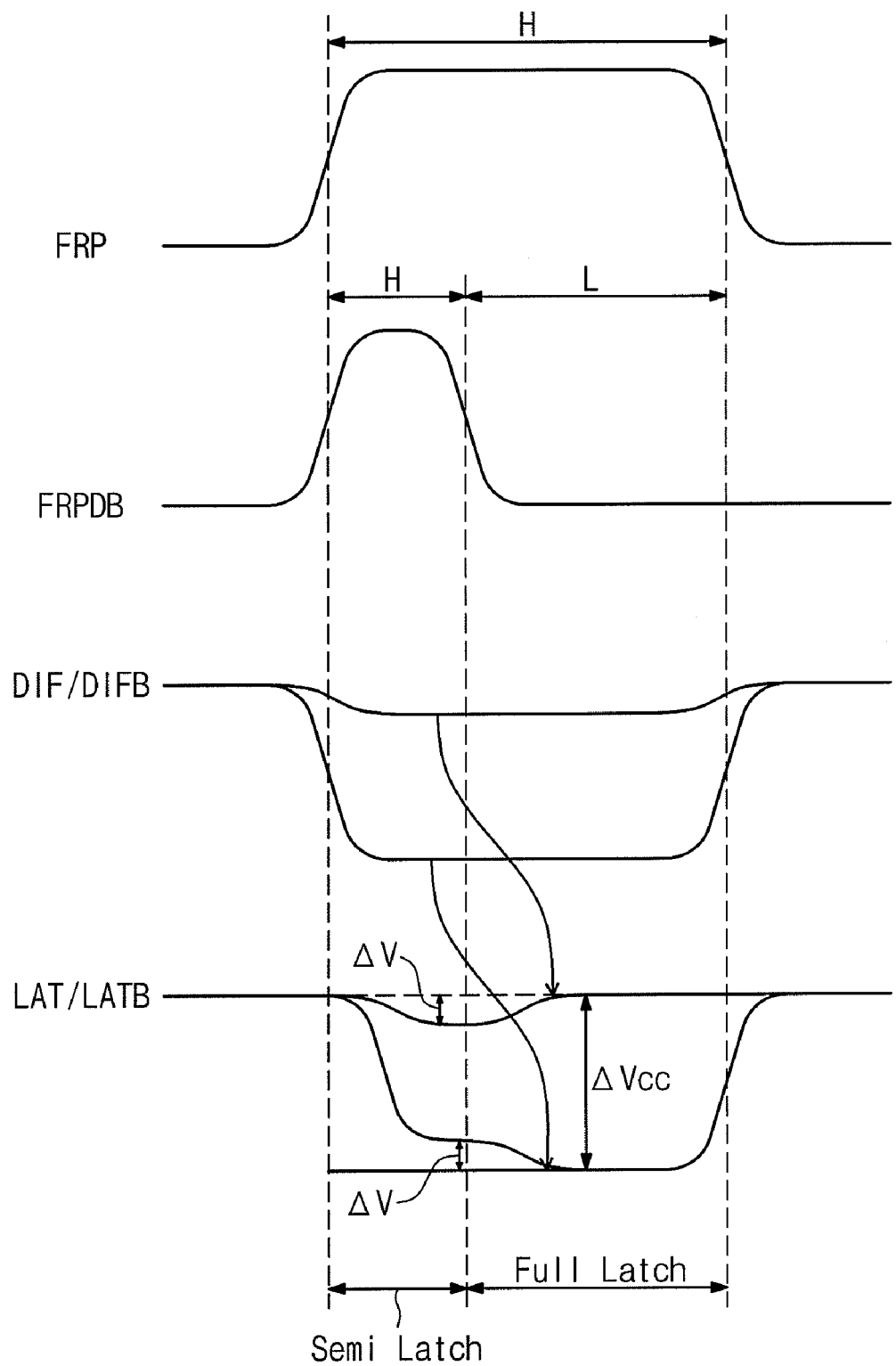
FIG. 3 is a timing diagram showing an operation of the data bus sense amplifier when there is an input of normal data.
Figure 4:
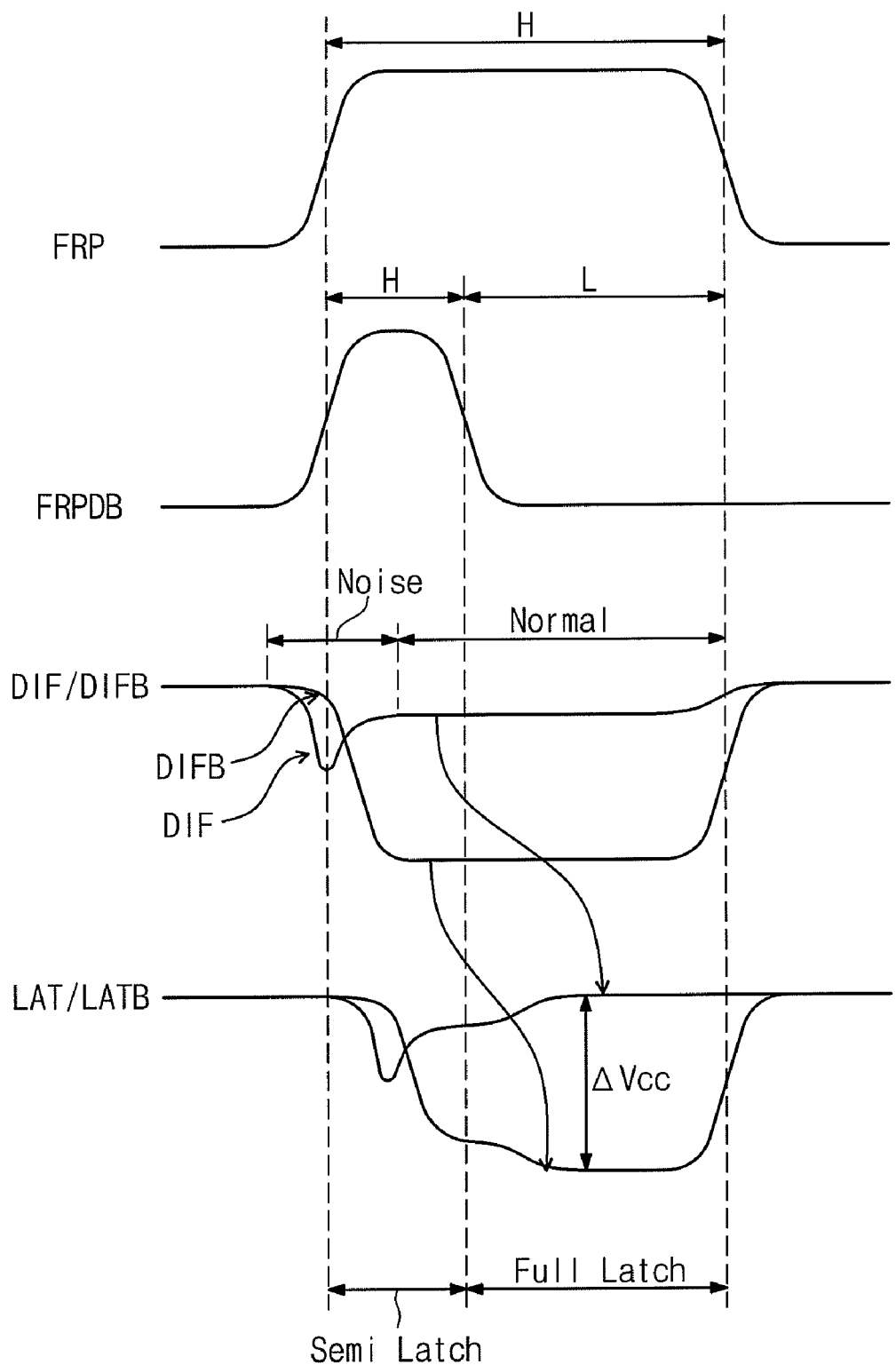
FIG. 4 is a timing diagram showing an operation of the data bus sense amplifier when there is an input of erroneous data.

FIG. 3 is a timing diagram showing an operation of the DB sense amplifier 30 of FIG. 2, when there is an input of normal data. And, FIG. 4 is a timing diagram showing an operation of the DB sense amplifier 30 when there is an input of erroneous data.

When the semiconductor memory device 100 of FIG. 1 is out of operation, the DB sense amplifier 30 receives the sense amplifier enabling signal FRP of a low level (L). The sense amplifier enabling signal FRP of a low level is applied to the gate of the NMOS transistor MN7 of the activation circuit 32 and the gates of the PMOS transistors MP3, MP4, and MP5 of the sense-amplifying circuit 31. The NMOS transistor MN7 is turned off by the sense amplifier enabling signal FRP of a low level and thereby the sense-amplifying circuit 31 is inactivated. Additionally, responding to the sense amplifier enabling signal FRP of a low level, the PMOS transistors MP3 and MP4 are turned on to supply the power source voltage Vcc to the nodes N1 and N2. Then, the nodes N1 and N2 are charged up (or precharged) to the power source voltage Vcc. Because the node N1 is connected to the output terminal LAT and the node N2 is connected to the output terminal LATB, the output terminals LAT and LATB are charged up to the power source voltage Vcc while the semiconductor memory device 100 is out of the reading operation.

The power source voltage Vcc charged at the node N1 is applied to the gates of the PMOS and NMOS transistors MP2 and MN2, while the power source voltage Vcc charged at the node N2 is applied to the gates of the PMOS and NMOS transistors MP1 and MN1. Then, the PMOS transistor MP1 is turned off by the voltage of the node N2 and the PMOS transistor MP2 is turned off by the voltage of the node N1. The NMOS transistor MN1 is turned on by the voltage of the node N2, by which the voltage of the node N1 is provided to the node N3 through the NMOS transistor MN1. The NMOS transistor MN2 is turned on by the voltage of the node N1, by which the voltage of the node N2 is provided to the node N4 through the NMOS transistor MN2.

When the semiconductor memory device 100 is out of the reading operation, the input terminals DIF and DIFB are charged up (or precharged) to the power source voltage Vcc by a precharging circuit (not shown) disposed between the BL and DB sense amplifiers 20 and 30. A procedure of precharging the input terminals DIF and DIFB is the same as the above-described sequence of charging the output terminals LAT and LATB.

The operation of the DB sense amplifier 30 will now be described when there is an input of normal data in the reading operation of the semiconductor memory device 100, referring to FIGS. 2 and 3.

The DB sense amplifier 30 receives the sense amplifier enabling signal FRP upon activation. The sense amplifier enabling signal FRP is activated with a high level (H). The sense amplifier enabling signal FRP of the high level is applied to the gate of the NMOS transistor MN7 of the activation circuit 32 and the gates of the PMOS transistors MP3, MP4 and, MP5 of the sense-amplifying circuit 31. The NMOS transistor MN7 is turned on by the sense amplifier enabling signal FRP of the high level, and thereby the sense-amplifying circuit 31 is activated. The sense amplifier 31 is activated only during a high level period of the sense amplifier enabling signal FRP, as shown in FIG. 3. During this operation, the PMOS transistors MP3, MP4 and, MP5 are turned off by the sense amplifier enabling signal FRP of the high level.

The DB sense amplifier 30 receives the latch-type selection signal FRPDB while accepting the sense amplifier enabling signal FRP of the high level. Referring to the timing diagram shown in FIG. 3 for the sense amplifier enabling signal FRP and the latch-type selection signal FRPDB, the latch-type selection signal FRPDB maintains a high level during a predetermined period and then falls down to a low level while the sense amplifier enabling signal FRP stays at the high level.

While the sense amplifier enabling signal FRP stays at the high level, the high level duration of the latch-type selection signal FRPDB forms a first sensing period, and the low level duration of the latch-type selection signal FRPDB forms a second sensing period. Thus, the active time of the DB sense amplifier 30 is composed of the first sensing period and the second sensing period.

The first sensing period of the latch-type selection signal FRPDB, if correct data is reloaded even after sensing erroneous data deformed by noise, is set to have a duration sufficient to detect and amplify the correct data. The first sensing period of the latch-type selection signal FRPDB is preliminarily established through the fabrication process of the semiconductor memory device.

During the first sensing period of the latch-type selection signal FRPDB, the DB sense amplifier 30 operates in the semi-latch type mode. During the second sensing period of the latch-type selection signal FRPDB, the DB sense amplifier 30 operates in the full-latch type mode.

With reference to FIGS. 2 and 3, in the semi-latch type mode, the DB sense amplifier 30 operates as follows.

The latch-type selection signal FRPDB of the high level turns on the NMOS transistors MN3 and MN4.

The DB sense amplifier 30 receives data through the input terminal DIF from the BL sense amplifier 20, and receives inverse data through the input terminal DIFB from the BL sense amplifier 20.

Hereinafter will be described the operation of the DB sense amplifier 30 when there is an input of high level data through the input terminal DIF.

Referring to the timing pattern of the input terminals DIF and DIFB shown in FIG. 3, if the input data is of the high level, the DB sense amplifier 30 receives a high-level signal through the input terminal DIF and receives a low-level signal through the input terminal DIFB. The input data signals are detected by the NMOS transistors MN5 and MN6 of the DB sense amplifier 30. More specifically, the data signal received through the input terminal DIF is applied to the gate of the NMOS transistor MN6 and the data signal received through the input terminal DIFB is applied to the gate of the NMOS transistor MN5.

Because the input data signals are low in voltage level, the NMOS transistors MN5 and MN6 for sensing such data signals are designed in a size so as to be able to be turned on even by a low voltage. Therefore, if a data signal received through the input terminal DIF is a high level, the NMOS transistor MN6 is turned on. Meanwhile, the NMOS transistor MN5 is also turned on by the inverse data signal of a low level that is received through the input terminal DIFB, but it is less conductive than the NMOS transistor MN6. Thus, there is a difference between the amounts of current flowing through the NMOS transistors MN5 and MN6 in accordance with the voltage levels of the data signals applied to their gates.

For instance, if the NMOS transistor MN6 is turned on by a high-level data signal and the NMOS transistor MN5 is also turned on by a low-level data signal, an amount of current flowing through the drain-to-source channel of the NMOS transistor MN6 is large relative to the amount of current flowing through the drain-to-source channel of the NMOS transistor MN5. In other words, the NMOS transistor MN6 is heavily turned on by the high-level data signal, while the NMOS transistor MN5 is lightly turned on by the low-level data signal.

The DB sense amplifier 30 operates to detect the input data from a difference between the current amounts flowing through the drain-to-source channels of the NMOS transistors MN5 and MN6. Hereinafter, the condition of one of the NMOS transistors MN5 and MN6, through which a relatively large current flows caused by the high-level data signal, is referred to as the 'on-state'. Similarly, the condition of the other of the NMOS transistors MN5 and MN6, through which a relatively small current flows caused by the high-level data signal, is referred to as the 'off-state'.

The NMOS transistor MN6 is conditioned to be in on-state by the high-level data signal. As described above, the NMOS transistors MN1 and MN2 are conditioned in the on-state, before activation of the DB sense amplifier 30, and the nodes N1 and N2 are charged up to the power source voltage Vcc. Because the NMOS transistor MN6 is in the on-state and the NMOS transistors MN2, MN4, and MN7 are turned on, the node N2 is discharged to the ground voltage GND. Thus, the potential of the node N2 goes down to low level.

Because the node N2 is sent to the low level, the PMOS transistor MP1 is turned on and the NMOS transistor MN1 is turned off. Thus, the power source voltage Vcc is provided to the node N1 by way of the PMOS transistor MP1. Then, the node N1 is charged up to the power source voltage Vcc and becomes the high level. Although the NMOS transistor MN3 is turned on, the NMOS transistor MN5 is turned on lightly, but is conditioned in the off-state as described above. Because a small amount of current flows out to the ground voltage GND from the node N1, there is generated a voltage drop ΔV shown in FIG. 3 at the node N1 in correspondence with the discharging current.

A voltage of the node N1 is output through the output terminal LAT, whereas a voltage of the node N2 is output through the output terminal LATB. Thus, referring to the semi-latch period in the timing pattern at the output terminals LAT and LATB shown in FIG. 3, a potential of the node N1 is sent to the high level, but is lower than the power source voltage Vcc by the voltage drop ΔV. Because the potential of the node N1 is lower than the power source voltage Vcc, the NMOS transistor MN2 is turned on more lightly than when the power source voltage Vcc is applied thereto. Thus, a current from the node N2 cannot flow out to drop the voltage of the node N2 to 0V. In other words, as described above, the PMOS transistors, MP1 and MP2, and the NMOS transistors MN1 and MN2 form a latch structure of two inverters. A potential of the node N2 is opposite to a potential of the node N1 in voltage level. Referring to the semi-latch period in the timing pattern at the output terminals LAT and LATB shown in FIG. 3, a potential of the node N2 is a low level, but is raised by the voltage drop ΔV.

In the full-latch type operation mode, the DB sense amplifier 30 operates as follows.

If the latch-type selection signal FRPDB goes to the low level, the NMOS transistors MN3 and MN4 are turned off by the latch-type selection signal FRPDB of the low level. Thus, the DB sense amplifier 30 operates in the full-latch type mode.

Because the NMOS transistor MN3 is turned off and the NMOS transistor MN1 is turned off in the semi-latch type mode, a voltage of the node N1 cannot be discharged to the ground voltage GND. Thus, a current flowing into the ground voltage GND decreases in amount, and the voltage of the node N1 goes to the power source voltage Vcc without a voltage drop. Referring to the full-latch period in the timing pattern at the output terminals LAT and LATB shown in FIG. 3, because the voltage drop ΔV does not occur in a potential of the node N1, which is different from the case of the semi-latch type mode, it is fully charged up to the power source voltage Vcc. Because a voltage of the node N1 is the power source voltage Vcc and a potential of the node N2 is opposite to the potential of the node N1, the potential of the node N2 goes to a lower level than in the case of the semi-latch type mode. Such voltage levels of the nodes N1 and N2 are illustrated in the full-latch period of the timing pattern for the output terminals LAT and LATB shown in FIG. 3.

Referring to the full-latch period in the timing pattern at the output terminals LAT and LATB shown in FIG. 3, the voltage gap ΔV between the nodes N1 and N2 results from amplifying a difference of input data signals by the power source voltage Vcc. Such an operation of the DB sense amplifier 30 is called 'full swing' operation. Therefore, the DB sense amplifier 30 in the full-latch type mode operates in the range of a full swing. Furthermore, the DB sense amplifier 30 in the full-latch type mode is able to reduce current dissipation because it consumes a smaller current discharged to the ground voltage GND than in the case of the semi-latch type mode.

Additionally, if there is an input of low-level data through the input terminal DIF, the DB sense amplifier 30 operates in the reverse to that of the former case in which there is an input of high-level data through the input terminal DIF, so that this case will not be further detailed.

Now, with reference to FIGS. 2 and 4, an operation of the DB sense amplifier 30 when there is an input of erroneous data in the reading operation of the semiconductor memory device 100 will be described.

States and operations of the transistors of the DB sense amplifier 30 according to the sense amplifier enabling signal FRP and the latch-type selection signal FRPDB are similar to that described above, so they will not be further described.

When there is an input of erroneous data, the DB sense amplifier 30 in the semi-latch type mode operates as follows.

The latch-type selection signal FRPDB of a high level turns on the NMOS transistors MN3 and MN4. The DB sense amplifier 30 receives data through the input terminal DIF from the BL sense amplifier 20, and receives inverse data through the input terminal DIFB from the BL sense amplifier 20.

If there is an input of high-level data through the input terminal DIF, the DB sense amplifier 30 operates as follows.

Normal data received through the input terminal DIF is a high level and normal data received through the input terminal DIFB is a low level. But, referring to a noise period (Noise) of the timing pattern for the input terminals DIF and DIFB shown in FIG. 4, because of a noise level, the data received through the input terminal DIF is lower than voltage level of the data received through the input terminal DIFB. In other words, the DB sense amplifier 30 inadvertently receives erroneous data, however, the NMOS transistor MN6 is less conductive than the NMOS transistor MN5. Furthermore, the error data received through the input terminal DIFB turns on the NMOS transistor MN5 to a greater degree than the NMOS transistor MN6 in the DB sense amplifier 30. Thus, the NMOS transistor MN5 is conditioned in the on-state, whereas the NMOS transistor MN6 is conditioned in the off-state.

Because the NMOS transistor MN4 is conditioned in the on-state and the NMOS transistors MN1, MN3, and MN7 are turned on, a voltage of the node N1 is discharged to the ground voltage GND. Then, as shown in the timing diagram of FIG. 4 for the output terminals LAT and LATB, the voltage of the node N1 is the low level, that is lower than a voltage of the node N2. Because the voltage of the node N1 is the low level, the node N2 becomes the high level higher than the voltage of the node N1.

According to the normal period (Normal) in the timing pattern shown in FIG. 4 for the input terminals DIF and DIFB, the DB sense amplifier 30 receives normal data again after the input of the erroneous data caused by noise. Thus, the DB sense amplifier 30 receives high-level data through the input terminal DIF and receives low-level data through the input terminal DIFB. An operation of the DB sense amplifier 30 operating in the semi-latch type mode when there is an input of high-level data through the input terminal DIF is the same as that of the DB sense amplifier 30 operating in the semi-latch type mode when there is an input of normal data. Therefore, a voltage of the node N1 becomes the high level, whereas a voltage of the node N2 becomes the low level. Referring to the semi-latch period of the timing diagram shown in FIG. 4 for the output terminals LAT and LATB, if erroneous data is input and thereafter correct data is input thereto, the DB sense amplifier 30 operating in the semi-latch type mode detects and amplifies the correct data, and outputs the amplified correct data.

If the DB sense amplifier 30 operates in the full-latch type mode when there is an input of erroneous data in the noise period (Noise) shown in FIG. 4 for the input terminals DIF and DIFB, the node N1 goes to the low level and the node N2 goes to the high level. As the DB sense amplifier 30 operates in the full-latch type mode, the NMOS transistors MN3 and MN4 are turned off. Because the node N1 is driven to the low level, the NMOS transistor MN2 is turned off. Because the node N2 is driven to the high level, the NMOS transistor MN1 is conditioned to be in the on-state. Thereafter, if there is an input of normal data, that is, correct data, the high-level data received through the input terminal DIF turns on the NMOS transistor MN6. The low-level data received through the input terminal DIFB turns off the NMOS transistor MN5. Because the NMOS transistors MN2~MN4 are turned off and the NMOS transistor MN5 is conditioned in the off-state, voltage levels of the nodes N1 and N2 are maintained without change. Thus, the DB sense amplifier 30 in the full-latch type mode detects and amplifies the erroneous data.

The DB sense amplifier 30 in the semi-latch type mode operates to detect and amplify correct data if the correct data is input after an input of erroneous data, however, which improves the noise margin characteristic.

If the latch-type selection signal FRPDB goes to a low level, the NMOS transistors MN3 and MN4 are turned off. At this time, the DB sense amplifier 30 operates in the full-latch type mode. The DB sense amplifier 30 in the full-latch type mode detects and amplifies normal data in the normal period of FIG. 4 for the input terminals DIF and DIFB. During this, the DB sense amplifier 30 in the full-latch type mode operates in the same pattern as that when there is an input of normal data as described above. Therefore, the DB sense amplifier 30 in the full-latch type mode operates in the range of a full voltage swing. Referring to the full-latch period of the timing diagram shown in FIG. 3 for the output terminals LAT and LATB, the voltage gap Δ V between the nodes N1 and N2 results from amplifying a difference of input data levels.

The DB sense amplifier 30 operating in the full-latch type mode is able to reduce current dissipation more than in the case of the semi-latch type mode, because it consumes a smaller amount of current flowing into the ground voltage GND.

As a result, the DB sense amplifier of a semiconductor memory device in accordance with an exemplary embodiment of the present invention operates in the semi-latch type mode according to a predetermined timing during a first sensing period in a reading operation. If correct data is input again thereto, even though there has been an input of erroneous data, the DB sense amplifier in the semi-latch type mode detects and amplifies the correct data. In addition, after operating in the semi-latch type mode, the DB sense amplifier operates in the full-latch type mode according to a predetermined timing during a second sensing period, causing the sensed data to fully swing to reduce current dissipation.

According to an exemplary embodiment of the present invention, the semiconductor memory device having the DB sense amplifier that is variable in latch type mode by reason of a predetermined timing is advantageous to stabilizing the performance of amplification and enhancing the immunity to noise.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
a memory cell array including memory cells arranged in rows and columns;
a row decoder selecting one of the rows and activating the selected row;
a bit-line sense amplifier detecting and amplifying data of the memory cells coupled to the selected row through the columns;
a data-bus sense amplifier detecting and amplifying data output from the bit-line sense amplifier; and
a control logic block enabling the bit-line and data-bus sense amplifiers in a reading operation, operating the data-bus sense amplifier in a semi-latch type mode for a predetermined period, and operating the data-bus sense amplifier in a full-latch type mode after the predetermined period.

2. The semiconductor memory device as set forth in claim 1, wherein the control logic block generates a latch-type selection signal and a sense-amplifier enabling signal.

3. The semiconductor memory device as set forth in claim 2, wherein the data-bus sense amplifier is enabled in response to activation of the sense-amplifier enabling signal.

4. The semiconductor memory device as set forth in claim 2, wherein the latch-type selection signal is activated in an active period of the sense-amplifier enabling signal during a predetermined period from the beginning of the active period.

5. The semiconductor memory device as set forth in claim 4, wherein the data-bus sense amplifier operates in the semi-latch type mode in response to activation of the latch-type selection signal.

6. The semiconductor memory device as set forth in claim 4, wherein the data-bus sense amplifier operates in the full-latch type mode in response to inactivation of the latch-type selection signal.

7. A semiconductor memory device comprising:
   a memory cell array including memory cells arranged in rows and columns;
   a first sense amplifier detecting and amplifying data of the memory cells coupled to the selected row through the columns; and
   a second sense amplifier detecting and amplifying data output from the first sense amplifier through a data bus,
   wherein the second sense amplifier is configured to operate in a semi-latch type mode for a first sensing period and to operate in a full-latch type mode for a second sensing period after the first sensing period.

8. The semiconductor memory device as set forth in claim 7, wherein the first and second sensing periods form an active period of the second sense amplifier.

9. A data sensing method of a semiconductor memory device having a memory cell array including memory cells arranged in rows and columns, the method comprising:
   sensing and amplifying data of the memory cells coupled to a selected row through the columns;
   sensing and amplifying the sensed and amplified data, which is output from a data bus for a first sensing period, in a semi-latch type mode; and
   sensing and amplifying the sensed and amplified data of the semi-latch type mode in a full-latch type mode for a second sensing period after the first sensing period.

* * * * *